United States Patent
Schinner (10) Patent No.: US 7,123,155 B2
(45) Date of Patent: Oct. 17, 2006

(54) OPERATIONAL MODE-BASED BATTERY MONITORING FOR A BATTERY-POWERED ELECTRONIC DEVICE

(75) Inventor: Charles E. Schinner, Windsor, CO (US)

(73) Assignee: Hewlett-Packard Development Company, L.P., Houston, TX (US)

(*) Notice: Subject to any disclaimer, the term of this patent is extended or adjusted under 35 U.S.C. 154(b) by 576 days.

(21) Appl. No.: 10/116,888

(22) Filed: Apr. 5, 2002

(65) Prior Publication Data

US 2003/0189418 A1    Oct. 9, 2003

(51) Int. Cl.
G08B 21/00  (2006.01)
(52) U.S. Cl. .................. 340/636.1; 340/636.12; 340/636.17; 340/636.2; 320/132; 320/134; 429/61; 429/90
(58) Field of Classification Search .......... 340/636.1, 340/636.11, 636.12, 636.15, 636.16, 636.2, 340/636.17; 320/132, 103, 139, 107, 134, 320/427; 429/90, 61
See application file for complete search history.

(56) References Cited

U.S. PATENT DOCUMENTS

| | | | |
|---|---|---|---|
| 3,979,657 A | 9/1976 | Yorksie | |
| 4,994,728 A | 2/1991 | Sasaki | |
| 5,317,362 A | 5/1994 | Takahaski | |
| 5,352,982 A | 10/1994 | Nakazawa et al. | |
| 5,381,096 A * | 1/1995 | Hirzel | 324/427 |
| 5,798,702 A | 8/1998 | Okamoto et al. | |
| 5,929,594 A * | 7/1999 | Nonobe et al. | 320/104 |
| 6,046,574 A | 4/2000 | Baranowski et al. | |
| 6,091,909 A | 7/2000 | McIntyre et al. | 396/278 |
| 6,107,802 A * | 8/2000 | Matthews et al. | 324/427 |
| 6,134,457 A | 10/2000 | Ha et al. | |
| 6,167,309 A * | 12/2000 | Lyden | 607/29 |
| 6,174,617 B1 * | 1/2001 | Hiratsuka et al. | 429/90 |
| 6,201,977 B1 | 3/2001 | Cathey et al. | 455/574 |
| 6,215,275 B1 | 4/2001 | Bean | |
| 6,233,016 B1 | 5/2001 | Anderson et al. | 348/372 |
| 6,351,611 B1 * | 2/2002 | Nonaka | 396/203 |

FOREIGN PATENT DOCUMENTS

| | | |
|---|---|---|
| EP | 0 592 965 A2 | 4/1994 |
| EP | 1 257 034 A2 | 11/2002 |

* cited by examiner

*Primary Examiner*—Davetta W. Goins (57) ABSTRACT

A method and an electronic device monitor a battery of the device with respect to device operational mode in one or both of battery charge level monitoring and battery cut-off determination. Mode-based monitoring employs a mode-specific wait period prior to performing a measurement used to determine a remaining charge level of a battery. The mode-specific wait period depends on the operational mode immediately preceding the measurement and therefore, accounts for battery recovery effects on measurement accuracy. Mode-based cut-off determination employs information regarding an impending operational mode to determine whether or not a remaining charge level of the battery is sufficient to support the mode. Only those operational modes for which there is sufficient remaining charge are enabled while operational modes for which there is insufficient remaining power are disabled.

33 Claims, 4 Drawing Sheets

OPERATIONAL MODE-BASED BATTERY MONITORING FOR A BATTERY-POWERED ELECTRONIC DEVICE

TECHNICAL FIELD

This invention relates to battery-powered devices. In particular, the invention relates to in-situ monitoring of a remaining charge level in and determining a cut-off point for a battery of a battery-powered device.

BACKGROUND ART

Battery-powered electronic devices, electronic devices that derive some or all of their operating power from one or more batteries, are popular, widely available and in relatively widespread use. In particular, electronic devices that use batteries as a primary operational power source are able to be portable and mobile, such that the devices are effectively free from a fixed location and power source. In many instances, portability is responsible for much of the market share attributed to such devices. Examples of popular battery-powered electronic devices include, but are not limited to, notebook and laptop computers, hand-held computers and personal digital assistants (PDAs), digital cameras, and cellular telephones.

Given that many battery-powered devices depend on batteries as a primary power source, most battery-powered electronic devices closely monitor a charge level remaining in the batteries in order to insure reliable operation of the device. Among other things, remaining charge is used to determine a cut-off point for the batteries at which the device automatically initiates a 'soft' shutdown. Automatic soft shutdown helps to insure data integrity and operational reliability when batteries near an end of useful charge. In addition, remaining charge level is also often employed by the electronic device to give a user of the device an indication of how much operational time may be available as well as warn the user of an impending or potential loss of operational power.

Inaccuracies in battery charge level monitoring, as well as a need to insure that shutdown occurs before the normal operation of a device is affected by loss of sufficient battery power, often lead to an effectively artificial reduction in the apparent charge life of a given set of batteries. Specifically, monitoring that determines a charge level of the battery to be lower than it actually is can result in a shutdown occurring sooner than it should. In addition, to insure normal operation of the device under all operating modes, the battery cut-off point is generally set conservatively based on a power requirement of an operational mode with a highest power utilization. In short, both the monitoring inaccuracies and the use of a conservative cut-off point typically result in an unnecessarily premature indication of effective end-of-charge life in many battery powered electronic devices.

Thus, it would be advantageous to be able to potentially extend a useable lifetime of a battery by improving battery charge level monitoring accuracy as well as reducing the need for unnecessarily conservative cut-off points for batteries used in battery-powered electronic devices. Such an improved monitoring accuracy and cut-off determination may extend the useful life of batteries in battery-powered electronic devices thus solving a long-standing need in the area of battery-powered devices.

SUMMARY OF THE INVENTION

The present invention employs an operational mode of an electronic device in one or both of battery monitoring and battery cut-off determination. In particular, mode-based monitoring, according to the present invention, employs a mode-specific or mode-determined wait period prior to performing a measurement used to determine a remaining charge level or energy level of the battery. The mode-specific wait period depends on the operational mode immediately preceding the measurement and therefore, accounts for the effects of battery recovery on measurement accuracy. Mode-based cut-off determination, according to the present invention, employs information regarding an impending mode to determine whether or not a remaining charge level or energy level in the battery is sufficient to support the impending mode. Only those operational modes for which there is sufficient remaining charge are enabled while operational modes for which there is insufficient remaining charge are disabled. Thus, whether or not the battery is cut-off depends on the impending operational mode.

In one aspect of the present invention, a method of mode-base monitoring of a remaining charge level of a battery used in an electronic device is provided. The method monitors the remaining charge level after the electronic device performs an operational mode. The method comprises waiting a mode-specific period of time after the performed operational mode before determining the remaining charge level of the battery. The mode-specific period of time is based on a recovery time for the battery, the recovery time being specific to the operational mode. The mode-specific wait period of time also may be based on a chemistry of the battery in addition to mode.

In some embodiments, the method of mode-based monitoring further comprises determining the operational mode that was performed and/or performing an operational mode of the electronic device. Following the waiting period, the method may further comprise measuring a characteristic of the battery to determine a remaining charge level of the battery.

In another aspect of the present invention, a method of mode-based cut-off determination for a battery used in an electronic device is provided. The method of mode-based cut-off determination comprises determining whether a remaining charge level of the battery is insufficient to perform an operational mode. The remaining charge level is 'insufficient' when the operational mode utilizes more power or energy than that associated with the remaining charge level. In addition, whether a remaining charge level is 'insufficient' may include a determined chemistry of the battery.

In some embodiments, the method further comprises disabling operational modes for which there is insufficient remaining charge. In these and in other embodiments, the method may further comprise performing a requested operational mode if that mode is not disabled. Depending on the embodiment, the method optionally may further comprise notifying a user of the electronic device that a disabled mode has been requested.

In yet another aspect of the invention, a method of mode-based monitoring and cut-off determination of a battery used in an electronic device is provided. The method comprises waiting a mode-specific period of time after an operational mode is performed, the mode-specific period of time being based on a recovery time for the battery, the recovery time being specific to the performed operational mode. The method further comprises determining a remaining charge level of the battery after waiting the mode-specific period of time.

In another aspect of the present invention, an electronic device having mode-based battery monitoring and/or mode-based battery cut-off determination is provided. The electronic device comprises a battery, a battery monitor, a controller, a memory, and a control program stored in memory. The control program comprises instructions that, when the controller executes the control program, implement mode-based monitoring and/or mode-based cut-off determination, according to the present invention. In some embodiments of the electronic device, the instructions of the control program implement mode-based battery monitoring. In other embodiments of the electronic device, the instruction of the control program implement mode-based battery cut-off determination. In yet other embodiments of the electronic device, the instruction of the control program implement both mode-based battery monitoring and mode-based battery cut-off determination.

The present invention is applicable to all battery-powered electronic devices but is particularly useful for electronic devices that have operational modes with widely varying power utilizations and/or devices that may employ batteries having any one of a plurality of different battery chemistries. Examples of such devices include, but are not limited to, digital cameras, portable compact disk (CD) players, and portable computers. Moreover, the present invention is applicable to all battery-types or battery-chemistries. For example, the present invention works for both rechargeable type batteries and non-rechargeable type batteries.

Advantageously, the present invention provides more accurate measurements of the charge remaining in a battery used in an electronic device. Specifically, by waiting a mode-specific period of time to measure remaining charge, the present invention mitigates the deleterious effects of battery recovery on charge measurement accuracy. In essence, by waiting a mode-specific period of time following a given operation or function before measuring the charge level of the battery, a more accurate estimation of remaining charge of the battery can be made. Moreover, by improving the accuracy of measurements of remaining charge, the present invention can facilitate an effective increase in a 'useful' life of a battery by enabling the battery to be safely discharged closer to an actual end-of-life discharge condition.

Likewise, mode-based cut-off determination, according to the present invention, can extend a useful or useable life of a battery used in the electronic device. In particular, instead of relying on a lowest common denominator to determine when a battery should be cut-off, the present invention advantageously enables some lower power modes to remain operational even when there is insufficient power or energy to enable all operational modes of the electronic device.

Certain embodiments of the present invention have other advantages in addition to and in lieu of the advantages described hereinabove. These and other features and advantages of the invention are detailed below with reference to the following drawings.

BRIEF DESCRIPTION OF THE DRAWINGS

The various features and advantages of the present invention may be more readily understood with reference to the following detailed description taken in conjunction with the accompanying drawings, where like reference numerals designate like structural elements, and in which.

MODES FOR CARRYING OUT THE INVENTION

Figure 1:
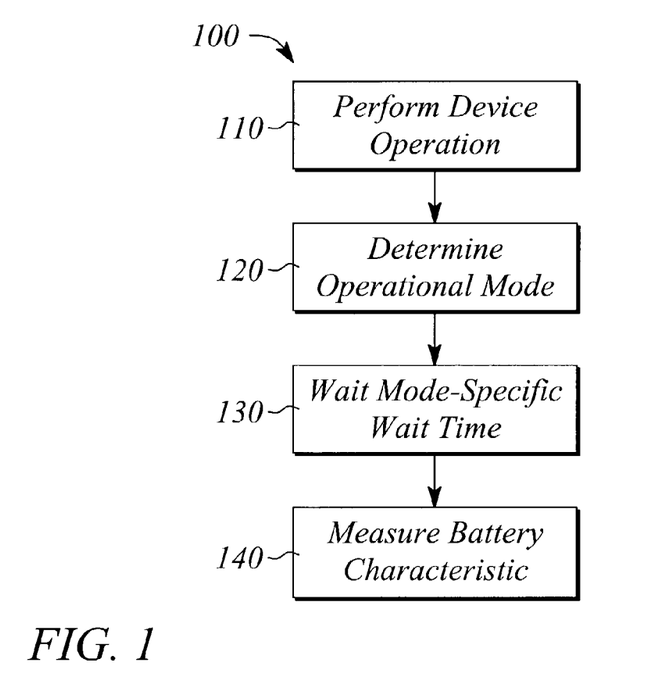
FIG. 1 illustrates a flow chart of a method of mode-based battery charge level monitoring according to the present invention.

FIG. 1 illustrates a flow chart of a method 100 of mode-base battery monitoring. The method 100 of mode-based battery monitoring determines a remaining charge level of or a remaining energy level in a battery used in an electronic device. The method of mode-based monitoring comprises performing 110 an operation or action of the electronic device. The operation may be any of a plurality of operations normally performed by the device. For example, in a digital camera, the operations may include, but are not limited to, capturing or recording an image, displaying an image on an image display of the camera, downloading image files from the camera to an external device, such as a personal computer (PC), and changing a zoom position of a zoom lens. In a portable compact disk (CD) player, the operations may include, but are not limited to, 'play', 'pause', 'load CD', and 'eject CD'.

The method 100 further comprises determining 120 an operational mode associated with the performed operation. As used herein, the operational mode is any operational state, or condition of the electronic device during which an operation or action of the device is performed. In general, modes are defined in a given electronic device by a way the device is used and/or an implementation of a device. In most cases, a mode is associated with, and may in fact be an action or operation of, the device. One skilled in the art is familiar with operational modes of electronic devices and can readily identify such modes for a given device.

In fact, the operational mode is generally known a priori from the performed 110 operation for most electronic devices. In other words, the operational mode is determined 120 by simply 'noting' which operation was performed 110. Thus, in most cases, the operation is essentially equivalent to the operational mode. For example, reviewing an image stored in memory is both an operation of a digital camera and an operational mode of the camera. As such, the terms 'operation' and 'operational mode' will be used interchangeably herein unless otherwise specified. Moreover in most electronic devices, performing 110 the operation and determining 120 the operational mode may be essentially a single, combined step. However in the general case, performing 110 the operation and determining 120 the operational mode are viewed as separate and distinct steps, for the purpose of clarity only.

Inherent in determining 120 the operational mode is determining a load or energy drain experienced by the battery as a result of the operational mode or operation thereof. In particular, operational modes in an electronic device often differ in power or energy utilized or in a related characteristic, such as a minimum voltage required.

Consider, for example, a digital camera and exemplary modes thereof. In a typical digital camera, there may be several fundamental modes, each of which exhibits power utilization that differs from the other modes. A first exemplary mode associated with viewing an image about to be captured or recorded may utilize very little power, for example. A second exemplary mode associated with downloading images to an external device, such as a personal computer (PC), may require somewhat less power than the first exemplary mode. Likewise, a third exemplary mode that is used to review images stored in memory of the camera may utilize more power than the second mode, while a fourth exemplary mode associated with capturing and recording an image may utilize more power than the other three exemplary modes.

Typically, the load on a battery associated with an operational mode may be determined from a known, an assumed, or a measured power consumption of the operation. A 'known' power consumption is a power consumption that is either computed from characteristics or parameters of portions of the electronic device active during the operational mode, derived from specifications of the electronic device and the operational mode therein, or otherwise determined by one skilled in the art from knowledge of the electronic device and the operational mode. For example, one skilled in the art, given knowledge of a particular digital camera having a zoom lens, can readily determine the power consumed by a lens extension during a zoom operation. Likewise, one skilled in the art can readily determine the power consumed by the camera during an image capture mode or an image review mode.

An 'assumed' power consumption is a power consumption that is based on a similar operational mode in the same or a similar device or a power consumption that one skilled in the art arrives at based on an assumption about the operational mode and electronic device. A 'measured' power consumption is a power consumption that is determined from measurements of an actual electronic device or a model of the electronic device for a situation in which the device is performing the operational mode.

The method 100 further comprises waiting 130 a mode-specific period of time $T_k$, the mode-specific wait time $T_k$ being assigned to or associated with the determined 120 operational mode. The mode-specific wait time $T_k$ is preferably based on a recovery time of the battery, the recover time being associated with a k-th mode. Therefore, waiting 130 a mode-specific period of time $T_k$ comprises determining the recovery time for the k-th mode, and assigning a wait time $T_k$ to the k-th mode that is based on the determined recovery time.

For example, a recovery time of 1-sec may be determined for an image capture mode of an example digital camera. The wait time for the capture mode, where the capture mode wait time is designated $T_{capture}$ in this example, may then be determined to be approximately 1-sec. In other words, the wait time $T_{capture}$ of 1-sec is a time that enables the battery of the example camera to recover following an application of a load associated with the capture mode. Thus, for this example, a wait time $T_{capture}=1$-sec is assigned to or used as the mode-specific wait time $T_k$ for the capture mode.

As used herein, the term 'recovery' as it relates to batteries refers to an empirically observed phenomena associated with the effects of loads on batteries. The effects are a result of the kinetics or the 'chemistry' of the battery. For example, batteries used in electronic devices are known to exhibit a battery voltage depression phenomenon when subjected to a load. When the battery is subjected to a load, the battery voltage decreases from that present prior to the application of the load. The decrease is attributed to a so-called 'internal resistance' of the battery. While often called 'internal resistance', the depression is largely a result of the battery kinetics or chemical process within the battery that produces an electric current.

When the load is removed, the battery voltage does not immediately return to the level present prior to the application of the load. Instead, the battery voltage remains depressed for a period of time and then returns only gradually to a level close to the pre-load level. As with the internal resistance, the gradual return to a nearly pre-load battery voltage is due to the battery kinetics. The time that it takes for the battery voltage to recover from the depression associated with a given load is referred to herein as a 'recovery time' or a 'recovery period'. Similar effects are known for other battery characteristics, such as peak current. In general, the recovery of a battery is affected by a total load applied, a period of time the load is applied, and a charge level remaining in the battery when the load is applied and/or removed.

The recovery is also known to be affected by battery chemistry. In particular, for a given load and a given battery size or energy capacity, the recovery time generally will be different for batteries having different chemistries. For example for a given load or load condition, an alkaline battery will typically have a different recovery time than that of a Nickel Metal Hydride (NiMH) battery. Likewise, a NiMH battery will have a different recovery time than a Nickel Cadmium (NiCd) battery, and so on. Thus, recovery of a battery is generally both a function of the load applied as discussed hereinabove and the chemistry of the battery.

The recovery, or more particularly the recovery time, associated with a given battery characteristic can and does impact an accuracy associated with determining the remaining charge stored in the battery using that characteristic. For example, if remaining charge is determined by measuring battery voltage, a measurement during the recovery period will tend to indicate a lower remaining charge than a measurement made after the battery has recovered (i.e., after a period of time approximately greater than or equal to the recovery time). Thus, measurements of battery voltage made during battery recovery can lead to inaccuracies in the determination of remaining charge level.

Moreover once the load is known, one skilled in the art also can readily ascertain an effect that the load has on the battery without undue experimentation. In particular, the recovery time that is sufficient to return a battery voltage to approximately an unloaded or an approximately quiescent state once the load is removed can be readily determined empirically by one skilled in the art for a given combination of a battery type (i.e., battery chemistry) and electronic device.

Generally however, according to the method 100, it is not necessary to wait 130 for a wait time $T_k$ equal to an entire recovery time for a given load. In most cases, the wait time $T_k$ is a time that is determined to be long enough, such that the recovery of the battery does not significantly effect the measurement of remaining charge in the battery. For example, in many cases a wait time $T_k$ of 80% to 90% of the entire recovery time will sufficiently minimize the effects of battery recovery on a measurement of battery voltage that is used to determine remaining charge, as described further below. One skilled in the art can readily determine a relationship between the battery recovery time and the mode-specific wait time $T_k$ for a particular electronic device, battery chemistry, and mode or modes thereof.

Moreover, in addition to being based on a mode-specific load, the mode-specific wait time $T_k$ may be based on a length of time that the operational mode is active and/or a charge level or energy level remaining in the battery. For example, the mode-specific wait time $T_k$ may be lengthened from a nominal value for a particular mode if the mode is active for a period of time that is longer than a nominal period of time for that mode. Likewise, the mode-specific wait time $T_k$ may be shortened from the nominal value if the mode is active for a shorter period of time than a nominal time. Alternatively, for some modes, the mode specific wait time $T_k$ may be determined as a product of a mode-specific wait factor or value and a length of time the mode is active.

Similarly, the mode-specific wait time $T_k$ may be lengthened or shorten at different stages in a discharge profile of the battery as is deemed appropriate based on knowledge of the effect of discharge on the recovery time of the battery. Thus, as the battery is discharged, the mode-specific wait time $T_k$ may be gradually increased for one or more of the modes to account for a general lengthening of the recovery with respect to discharge level of the battery, for example. Thus, the mode-specific wait time $T_k$, while specific for a given mode, may be vary in value according to how the device has been used over time.

In some embodiments, the mode-specific wait time $T_k$ is also a function of a chemistry of the battery in addition to being a function of the mode. In particular, a different mode-specific wait time $T_k$ for each mode may be employed for each different battery chemistry that is used in the electronic device. For example, a set of mode-specific wait times $T_k$ may be determined for a first chemistry and a different set of mode-specific wait times $T'_k$ may be determined for a second chemistry, and so on. Thus, in some embodiments, the term 'mode-specific' is more precisely defined as 'mode-specific and chemistry-specific'. However, herein it will be understood that the term 'mode-specific' includes embodiments that also account for the battery chemistry being used.

Moreover, the method 100 optionally may further comprise determining a chemistry of the battery being used in the device (not illustrated in FIG. 1) prior to waiting the mode-specific time $T_k$. Determining the battery chemistry may be accomplished through an input from a user of the device or may be 'hardwired' or 'hard-coded' in the device at a time of manufacture. For example, when the user installs a battery, the device may request that the user indicate to the device which one of a set of allowed chemistries corresponds the battery just installed.

Alternatively, the device may employ a method of battery chemistry determination that directly or indirectly identifies the chemistry of the battery. For example, Bean et al., U.S. Pat. No. 6,215,275, incorporated herein by reference, discloses a method of battery chemistry determination or identification that utilizes a simple test circuit in conjunction with a microcontroller that measures several distinct voltages across a battery to determine battery chemistry. In another example, Bean et al., in a co-pending application entitled "A Method of Battery Chemistry Identification Through Analysis of Voltage Behavior", Ser. No. 09/859,015, which was filed May 14, 2001 and is incorporated herein by reference, disclose several in situ measurements of battery voltages under various loaded and unloaded battery conditions for battery chemistry determination. The described and cited methods, as well as any other method that one skilled in the art might devise to determine battery chemistry of a battery used in the electronic device, are each within the scope of the present invention.

In general, determining battery chemistry need be performed only once, e.g., immediately following replacement of the battery in the device. However, it is within the scope of the present invention to perform battery chemistry determination multiple times for each replaced battery as well. The determined chemistry is employed to determine the mode-specific wait time $T_k$ along with mode.

Following waiting 130, the method 100 may further comprise measuring 140 a characteristic of the battery to determine a remaining charge level of the battery. For example, a voltage of the battery may be measured 140 to determine the remaining charge level of the battery. Advantageously, since the measurement 140 is performed following the mode-specific wait time $T_k$, the measurement is largely free of errors that may have been introduced in such a measurement due to the recovery of the battery.

Figure 2:
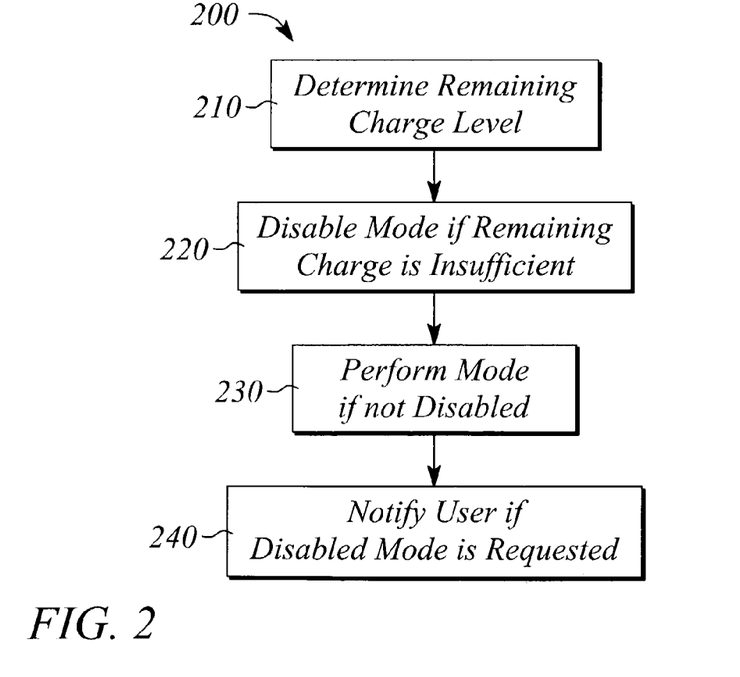
FIG. 2 illustrates a flow chart of a method of mode-based battery cut-off determination according to the present invention.

In another aspect of the present invention, a method 200 of mode-based cut-off determination of a battery used in an electronic device is provided. FIG. 2 illustrates a flow chart of the method 200 of mode-based cut-off determination according to the present invention. As used herein, the term 'cut-off' or 'cut-off point' refers to a point in a discharge profile of the battery at which there is insufficient power to operate the device. Generally, the cut-off determination is made by the electronic device based on a measurement or measurements of the remaining battery charge. Conventionally, the device performs a soft shut-down or enters a standby mode when the cut-off point is reached.

The method 200 of mode-based cut-off determination comprises determining 210 a remaining charge level of the battery. Determining 210 the remaining charge level may comprise measuring a characteristic of the battery, such as a battery voltage and computing a remaining charge level. For example, the remaining charge level may be computed using a look-up table or a similar method that relates the remaining charge level to the measured battery voltage. One of ordinary skill in the art is familiar with a variety of methods of determining 210 the remaining charge level on a battery from measurements of characteristics of the battery. All such methods for determining 210 the remaining charge level of a battery in an electronic device are within the scope of the present invention.

In particular, in a preferred embodiment of the present invention, the remaining charge level is determined 210 by measuring a voltage of the battery. The measured voltage is then compared to voltages in a look-up table or on a curve of voltage with respect to remaining charge on the battery. From the comparison, a remaining charge value corresponding to the measured voltage indicates the remaining charge level in the battery.

In some embodiments, the method 200 optionally may further comprise determining a chemistry of the battery (not illustrated in FIG. 2) at some point prior to determining 210 the remaining charge level. Batteries based on different chemistries are known to have different amounts of remaining power or energy at different points in their respective discharge profiles wherein the points are each indicated by a measurement of a particular characteristic of the battery, such as voltage. The determined chemistry of the battery may be employed to modify the determination 210 of remaining charge level. For example, if a voltage is measured and compared to a look-up table or curve to determine remaining charge level, the determined chemistry may be employed to select a look-up table or curve corresponding to the determined chemistry from among a set of such look-up tables or curves for various chemistries.

The method 200 further comprises disabling 220 operational modes for which there is insufficient remaining charge. Equivalently, an operational mode may be disabled 220 if the charge remaining is insufficient to produce a minimum voltage necessary for the mode, given the load attributed to the mode. Insufficient remaining charge means that the operational mode utilizes more power than that which remains. Thus, given information regarding which modes are available in the device, a corresponding minimum remaining charge level necessary for normal operation of each mode may be readily determined. From the corresponding minimum remaining charge level, a determination can readily be made whether a given mode can operate properly, given the determined 210 remaining charge level. In short, if the determined 210 remaining charge level is insufficient for a given mode, the mode is disabled 220.

For example, a particular mode, such as an image capture mode in a digital camera, may have a minimum voltage level for normal operation. Without the minimum voltage, the camera may not reliably perform the image capture. In other words, if the determined 210 remaining charge level of the battery equates to a battery voltage that is less than the minimum voltage level for the normal image capture mode operation, then the image capture mode may not operate properly if requested by the user. Therefore, such a mode is disabled 220, according to the present invention.

An operational mode may be disabled 220 in a variety of ways, all of which are generally dependent on a specific electronic device and the implementation of the mode in the device. For example, in some electronic devices, a software flag may be set to indicate that a given mode is disabled 220. In other electronic devices, a hardware-based logic line may be asserted to disable 220 a given operational mode, for example. One of ordinary skill in the art may readily devise an assortment of different approaches to disabling a mode in a particular electronic device, all of which are within the scope of the present invention.

The method 200 further comprises performing 230 a requested operational mode if that mode is not disabled 220. Thus, if the user of the electronic device requests a particular operational mode in a manner consistent with the electronic device, the mode is performed 230, if and only if the requested mode is not disabled 220. A decision tree or similar approach may be used to implement such a sequence of disabling 220 and performing 230 steps using flags, for example.

For example, if a software flag is used in the electronic device to identify a disabled function, the flag associated with a requested operational mode is 'tested' to see whether or not that flag is set. In this example, if the flag is set indicating that the mode is disabled 220, the operational mode is not performed 230. If the flag is not set, the operational mode is performed 230 in a normal manner.

The method 200 further comprises optionally notifying 240 the user of the electronic device that a requested mode has been disabled. For example, with a digital camera, a 'Low Bat' icon may be illuminated on a status display if a requested operational mode is disabled 220. Alternatively, the user may be notified 240 by displaying a message to the user. The displayed message may inform the user that the requested operational mode is not available due to lack of power, for example. A combination of illuminating a 'Low Bat' icon and displaying a message may also be employed. In yet another example of notification 240, a list of enabled and/or disabled operational modes may be provided to the user by way of one of the displays available on the device.

Figure 3:
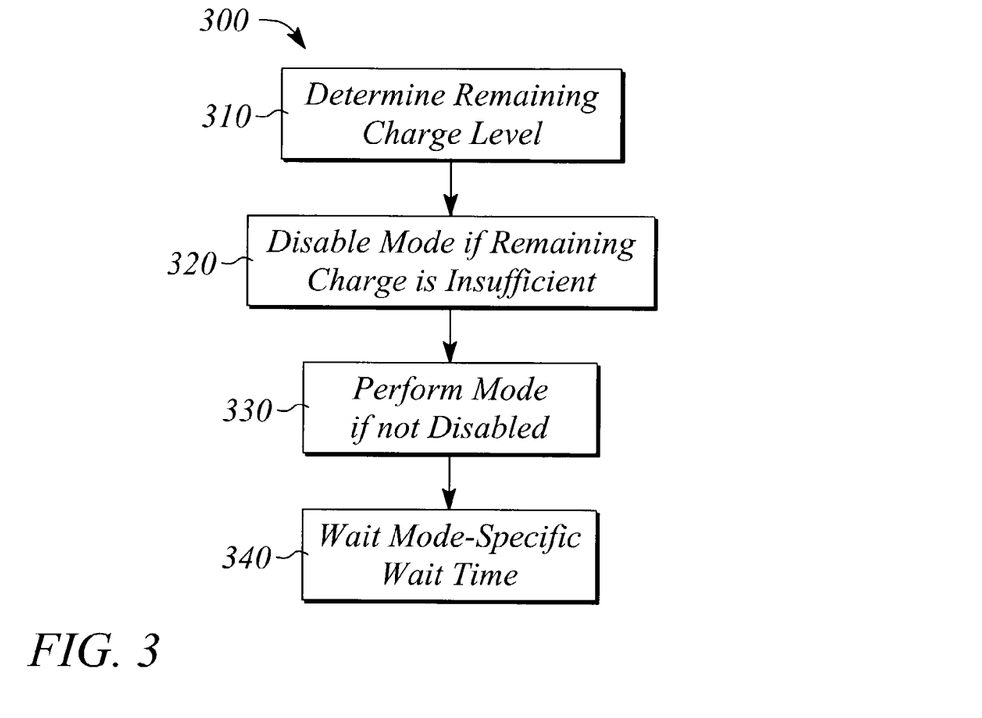
FIG. 3 illustrates a flow chart of a method of mode-based battery cut-off determination and mode-based battery charge level monitoring according to the present invention.

In yet another aspect of the present invention, a method 300 of mode-based monitoring and mode-based cut-off determination for a battery powered electronic device is provided. A flow chart of the method 300 of mode-based monitoring and mode-based cut-off determination is illustrated in FIG. 3. The method 300 essentially combines aspects of the method 100 and method 200 of the present invention.

The method 300 comprises determining 310 a remaining charge level of a battery. The method 300 further comprises disabling 320 a mode for which there is insufficient power for proper operation. The method 300 further comprises performing 330 a mode if the mode has not been disabled 320. The method 300 further comprises waiting 340 a mode-specific wait time $T_k$ corresponding to the performed 330 mode after the mode is performed 330. Waiting 340 the mode-specific wait time $T_k$ occurs at an end of the performed 330 mode. After waiting 340 the mode-specific wait time $T_k$, the method 300 may be repeated starting at determining 310.

Figure 4:
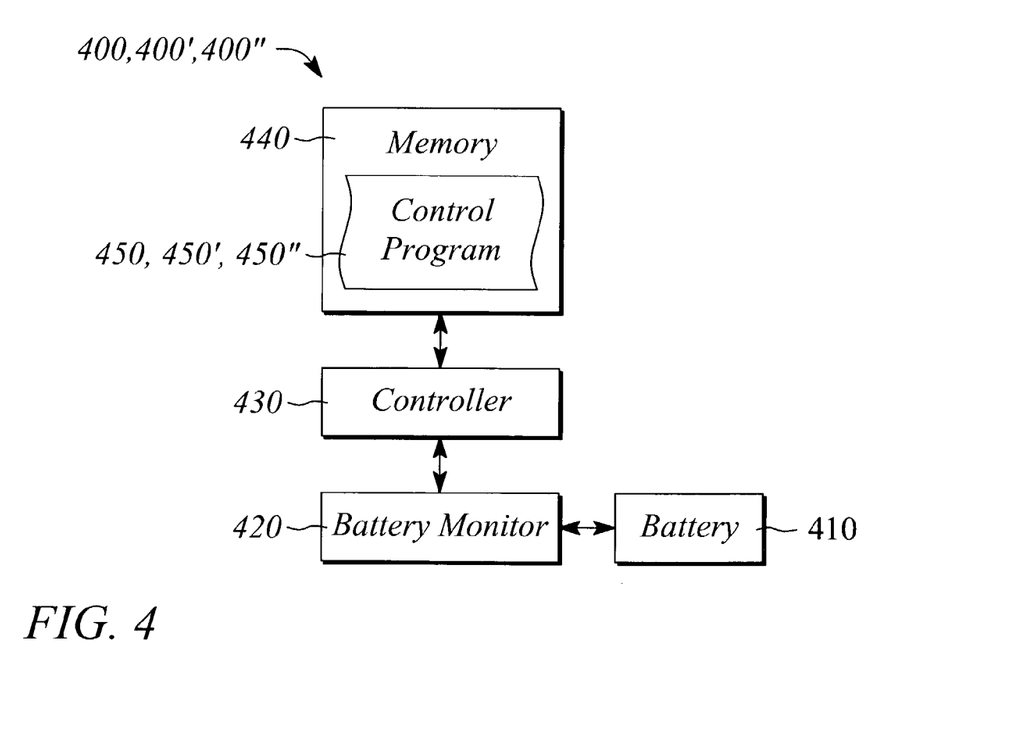
FIG. 4 illustrates a block diagram of some embodiments of a digital camera having mode-based battery monitoring and/or mode-based battery cut-off determination according to the present invention.

In yet another aspect of the present invention, an electronic device 400 having mode-based battery monitoring and/or mode-based battery cut-off determination is provided. FIG. 4 illustrates a block diagram of the electronic device 400. The electronic device 400 comprises a battery 410, a battery monitor 420, a controller 430, a memory 440, and a control program 450 stored in the memory 440. The control program 450 comprises a set of instructions. The battery monitor 420 measures a characteristic of the battery 410 and communicates a measured result to the controller 430 to provide battery monitoring. The controller 430 executes the control program 450, the instructions of which implement mode-based monitoring and/or mode-based cut-off determination, according to the present invention, in part using the measured result.

In some embodiments of the electronic device 400, the instruction of the control program 450 implement mode-based battery monitoring. In particular, the instructions of the control program 450 perform an operation of the electronic device and determine an operational mode associated with the performed function. The instructions further wait a mode-specific period of time following an end of the operation. The mode-specific wait time is associated with the determined operational mode and preferably, is based on the recovery time of the battery, as described hereinabove. In addition, as described hereinabove with respect to method 100, the mode-specific period of time may be both 'mode-specific' and battery 'chemistry-specific'. In other words, different mode-specific wait times may be employed to account for different chemistries of the battery 410. Following the waiting period, the instructions may further measure a characteristic of the battery to determine a remaining charge level of the battery. In a preferred embodiment, the control program 450 implements the method 100 of mode-based monitoring of the present invention.

In other embodiments of the electronic device 400', the instruction of the control program 450' implement mode-based battery cut-off determination according to the present invention. The instructions of the control program 450' determine a remaining charge level of the battery and disable operational modes for which there is insufficient remaining charge. The instructions enable a requested operational mode to be performed if that mode is not a disabled. The instructions optionally may notifying a user of the electronic device that a disabled mode has been requested, or provide a list of disabled modes and/or a list of enabled modes that is displayed for the user to view. In a preferred embodiment, the control program 450' implements the method 200 of mode-based battery cut-off determination of the present invention.

In yet other embodiments of the electronic device 400", the instructions of the control program 450" implement both mode-based monitoring and mode-based battery cut-off determination. Specifically, the instructions of the control program 450" determine a remaining charge level of a battery and disable a mode for which there is insufficient power for proper operation. The instructions further enable a mode to be performed if the mode has not been disabled and the user selects the non-disabled mode. The instruction further implement waiting a mode-specific wait time $T_k$ corresponding to the performed mode after the performed mode has ended. After waiting the mode-specific wait time $T_k$, the instructions may repeat the mode-based monitoring and cut-off determination of the battery starting at determining a remaining charge level. In a preferred embodiment, the control program 450" implements the method 300 of mode-based monitoring and mode based battery cut-off determination.

To better understand the present invention, consider the following example of the electronic device 400" in the form of a digital camera. The digital camera 400" provides mode-based monitoring and mode-based cut-off determination of a battery 410 installed in the digital camera 400" through execution of a control program 450" by the controller 430. The description hereinbelow of the digital camera 400" is exemplary only and is not intended to limit the scope of the present invention. The battery monitor 420 of the example camera 400" measures a battery voltage of the battery 410. The controller 430 utilizes the measured battery voltage to determine a charge remaining in the battery 410.

Furthermore, for the purposes of the discussion of this example and in no way by limitation, the camera 400" is assumed to have four operational modes. The four exemplary modes are referred to hereinbelow as 'review' mode, 'capture' mode, 'PC' mode, and 'view' mode. Thus, mode 1 is review mode, mode 2 is capture mode, mode 3 is PC mode, and mode 4 is view mode. The review mode in the example camera 400" requires a minimum battery voltage $V_{review}$ to operate properly. Similarly, to operate reliably, the capture mode needs a minimum battery voltage $V_{capture}$, the PC mode needs a minimum battery voltage $V_{PC}$, and the view mode requires a minimum battery voltage $V_{view}$. For the purposes of discussion, the $V_{capture}$ is greater than the $V_{review}$. Similarly, the $V_{review}$ is greater than the $V_{view}$, and the $V_{view}$ is greater than the $V_{PC}$. Moreover, wait times have been determined for each of these modes of the example camera 400". The wait time $T_k$ for the review mode is $T_{review}$ while the wait time for the capture mode is $T_{capture}$. The wait time for the PC mode is $T_{PC}$ and the wait time for the view mode is $T_{view}$.

Figure 5:
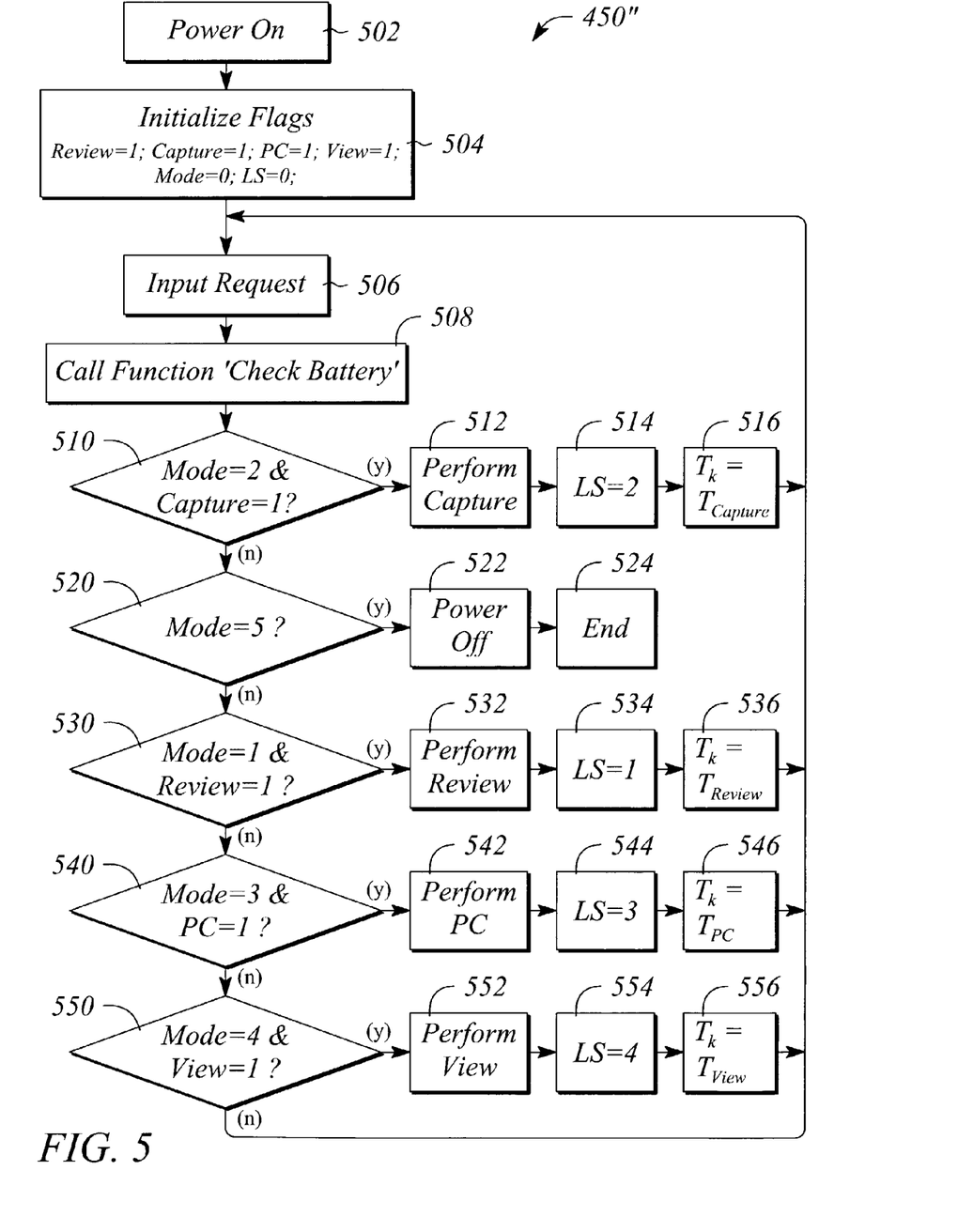
FIG. 5 illustrates an exemplary flow chart of a digital camera control program incorporating the mode-based battery charge level monitoring and mode-based battery cut-off determination of the present invention.

FIG. 5 illustrates a flow chart of a portion of a control program 450" used to implement the mode-based monitoring and mode-based cut-off determination for the battery 410 in the example camera 400". Flags having the name of a corresponding mode are used in the program 450" to indicate whether the mode is enabled (e.g., Flag=1) or disabled (e.g., Flag=0). For example, if the review mode is disabled, the flag Review is set to '0'. Similarly, if the view mode is enabled, the flag View is set to '1'. A variable of the program 450" called 'Last State' is used to indicate which of the modes was performed. The variable Last State (LS) indicates the performed mode using a number corresponding to the mode. Thus, the LS set to '3' indicates that the PC mode was performed while the LS set to '1' indicates that the review mode was performed. The LS set to '0' indicates no performed mode and is used for initialization purposes. A variable Mode is used to store a number (i.e., 0–5) indicating which mode has been requested by the user of the camera 400". The variable Mode equal to '5' is used to indicate a request to shutdown and turn off power to the camera 400". For clarity, the flow chart illustrated in FIG. 5 omits details not directly associated with implementing the mode-based monitoring and mode-based cut-off determination for the example camera 400".

Referring to FIG. 5, the control program 450" begins at a Power On 502 operation. During the Power On 502 operation, power is applied to the electronics of the camera 400" and various components thereof are initialized. The Power On 502 operation is followed by an Initialize Flags 504 operation, wherein the various mode flags are initialized to '1' and the LS variable and the Mode variable are both initialized to '0'. In addition, the wait time $T_k$ is initialized to '0'. A mode requested by the user is determined by an Input Request 506 and the Mode variable is assigned a number corresponding to the requested mode (i.e., Mode=1, 2, 3, 4 or 5). Then a Function Call 508 is made to a Check Battery function.

Figure 6:
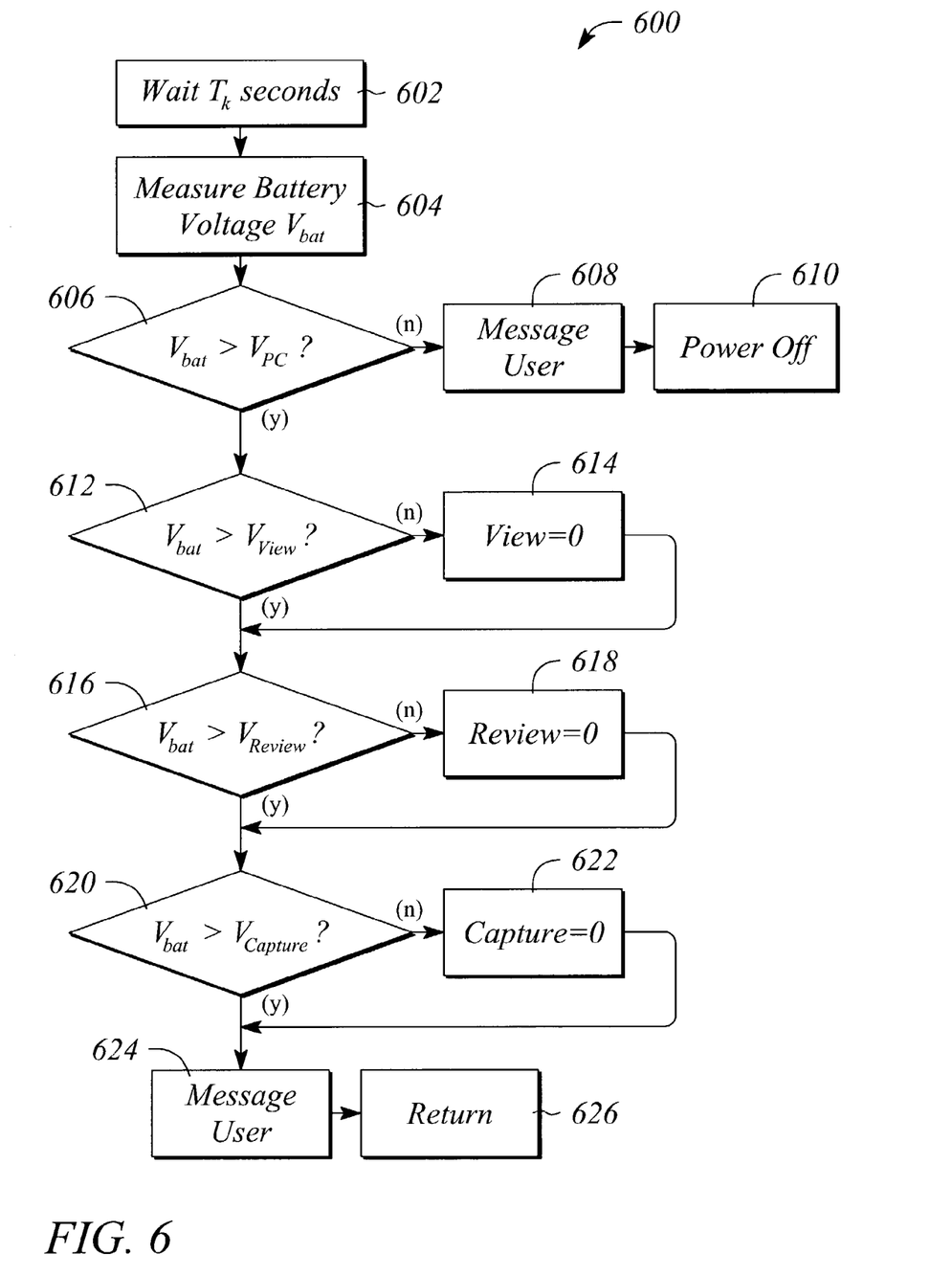
FIG. 6 illustrates a flow chart of an embodiment of a Check Battery function.

FIG. 6 illustrates a flow chart of an embodiment of the Check Battery function 600. In the Check Battery 600 function, a Wait 602 causes the function to wait for $T_k$ seconds following which a Measure Voltage 604 causes the battery monitor 420 to measure a battery voltage $V_{bat}$ for the battery 410. The measured battery voltage $V_{bat}$ is compared to the minimum voltage $V_{PC}$ needed by the PC mode in a first Decision block 606 of the Check Battery function 600. If the voltage $V_{bat}$ is not greater than the voltage $V_{PC}$ then a message is displayed to the user indicating that there is insufficient operating power by a Message block 608, and a Power Off 610 initiates a shutdown that ultimately shuts off power to the camera 400".

On the other hand, if the voltage $V_{bat}$ is greater than the voltage $V_{PC}$, a second Decision block 612 of the Check Battery function 600 compares the voltage $V_{bat}$ to the minimum voltage $V_{view}$ for the view mode. If the voltage $V_{bat}$ is not greater than the voltage $V_{view}$, the View flag is set to '0' in a first Set block 614 indicating insufficient voltage for the view mode. A third Decision block 616 of the Check Battery function 600 compares the voltage $V_{bat}$ to the minimum voltage $V_{review}$ for the review mode. If the voltage $V_{bat}$ is not greater than the voltage $V_{review}$, the Review flag is set to '0' in a second Set block 618 indicating insufficient voltage for the review mode. A fourth Decision block 620 of the Check Battery function 600 compares the voltage $V_{bat}$ to the minimum voltage $V_{capture}$ for the capture mode. If the voltage $V_{bat}$ is not greater than the voltage $V_{capture}$, the Capture flag is set to '0' in a third Set block 622 indicating insufficient voltage for the capture mode. A second Message block 624 of the Check Battery function 600 displays which of the modes are available and which modes are disabled. The Check Battery function 600 ends with a Return block 626 that returns to the control program 450".

Referring again to FIG. 5, upon returning to the control program 450" from the Check Battery function 600, a first Decision block 510 of the control program 450" checks the requested mode and the Capture flag. If the Mode variable equals '2' and the Capture flag equals '1', indicating that capture mode is requested and enabled, the capture mode is performed 512, the LS flag is set 514 to '2', and the wait time $T_k$ is set 516 to equal to $T_{capture}$. The program 450" then loops back to the Input Request block 506. If the Mode variable is not equal to '2' and/or the Capture flag equals '0', the program 450" continues to a second Decision block 520.

The second Decision block 520 of the control program 450" checks the requested mode. If the Mode variable is equal to '5', indicating a request for shutdown, then the Power Off 522 is performed to shut down the camera 400". After the Power Off 522 is complete, the program 450" ends 524. If the Mode variable is not equal to '5', then the program 450" proceeds to a third Decision block 530.

The third Decision block 530 of the control program 450" checks the requested mode and the Review flag. If the Mode variable equals '1' and the Review flag equals '1', the review mode is performed 532, the LS flag is set 534 to '1', and the wait time $T_k$ is set 536 to equal to $T_{review}$. The program 450" then loops back to the Input Request 506. If the Mode variable is not equal to '1' and/or the Review flag equals '0', the program 450" continues to a fourth Decision block 540.

The fourth Decision block 540 of the control program 450" checks the requested mode and the PC flag. If the Mode variable equals '3' and the PC flag equals '1', the PC mode is performed 542, the LS flag is set 544 to '3', and the wait time $T_k$ is set 546 to equal to $T_{PC}$. The program 450" then loops back to the Input Request 506. If the Mode variable is not equal to '3' and/or the PC flag equals '0', the program 450" continues to a fifth Decision block 550.

The fifth Decision block 550 of the control program 450" checks the requested mode and the View flag. If the Mode variable equals '4' and the View flag equals '1', the view mode is performed 552, the LS flag is set 554 to '4', and the wait time $T_k$ is set 556 to equal to $T_{view}$. The program 450" then loops back to the Input Request 506. If the Mode variable is not equal to '4' and/or the View flag equals '0', the program 450" simply loops back to the Input Request 506.

In the manner described in this example, the control program 450", when executed by the controller 430, uses the battery monitor 420 to determine whether or not there is enough voltage available from the battery 410 to perform each of the modes of the camera 400" prior to executing any of the modes. The determination is repeated after each mode. Moreover, the program 450" adjusts the wait time $T_k$ after each time a mode is performed, such that the wait time $T_k$ corresponds to the respective mode-specific wait time of the performed mode. Thus, when the battery is again monitored, the wait time $T_k$ is the mode-specific wait time. Given the discussion and example hereinabove, one of ordinary skill can readily construct the control program 450, 450', 450" using any standard computer programming language or construct.

Thus, there have been described methods 100, 200, 300 that provide mode-based monitoring and/or mode-based cut-off determination of a battery in an electronic device. In addition, an electronic device 400, 400', 400" having mode-based battery monitoring and/or mode-based battery cut-off determination has been described. It should be understood that the above-described embodiments are merely illustrative of the some of the many specific embodiments that represent the principles of the present invention. Clearly, those skilled in the art can readily devise numerous other arrangements without departing from the scope of the present invention.

What is claimed is:

1. A method of monitoring a remaining charge level of a battery in an electronic device after an operational mode is performed by the device, the operational mode comprising one or more operations of the device, the device obtaining at least some power from the battery, the method comprising:
    waiting a mode-specific period of time after the performed operational mode before determining the remaining charge level of the battery, the mode-specific period of time being based on a recovery time for the battery, the recovery time being specific to the operational mode.

2. The method of claim 1, wherein the mode-specific period of time is further based on a chemistry of the battery.

3. The method of claim 1, wherein waiting a mode-specific period of time comprises:
    determining the operational mode that was performed, each determined operational mode having an associated power consumption, the recovery time being based on the power consumption.

4. The method of claim 1, wherein waiting a mode-specific period of time comprises:
    determining a load experienced by the battery while the operational mode is performed, the recovery time being associated with the load, the recovery time being a time for the battery to recover from the load.

5. The method of claim 4, wherein the load is determined from power consumed during the operational mode, the power consumed being different for each operational mode.

6. The method of claim 1, further comprising:
    determining a chemistry of the battery prior to waiting the mode-specific period of time, the determined chemistry being employed to determine the mode-specific period of time.

7. The method of claim 1, further comprising:
    measuring a characteristic of the battery after waiting the period of time to determine the remaining charge level of the battery.

8. The method of claim 1, further comprising:
    performing the operational mode prior to waiting, the operational mode being any one of a plurality of operational modes normally performed by the device.

9. The method of claim 1, wherein the mode-specific wait period of time is one or more of greater than, less than and equal to the recovery time depending on the operational mode.

10. A method of determining a cut-off point of a battery used in an electronic device, the electronic device obtaining at least some power from the battery, the cut-off point being a point in a discharge profile of the battery at which there is insufficient power to perform an operational made of the device, the method comprising:
    determining whether a remaining charge level of the battery is insufficient to perform an operational mode, the remaining charge level being insufficient when the operational mode utilizes more power than that associated with the remaining charge level;
    measuring a characteristic of the battery;
    computing a remaining charge from the measured battery characteristic; and
    using a look-up table to relate the measured battery characteristic to the remaining charge, the look-up table having a plurality of values for the characteristic and corresponding remaining charge values.

11. A method of determining a cut-off point of a battery used in an electronic device, the electronic device obtaining at least some power from the battery, the cut-off point being a point in a discharge profile of the battery at which there is insufficient power to perform an operational mode of the device, the method comprising;
    determining whether a remaining charge level of the battery is insufficient to perform an operational mode, the remaining charge level being insufficient when the operational mode utilizes more power than that associated with the remaining charge level; and
    disabling the operational mode of the device when the remaining charge level of the battery is determined to be insufficient to perform the operational mode:
    wherein disabling the operational mode of the device comprises one or both of:
        setting a software flag to disable a particular operational mode when it is determined that the battery has an insufficient remaining charge level associated with the particular operational mode; and
        asserting a hardware-based logic line to disable a particular operational mode when it is determined that the battery has an insufficient remaining charge level associated with the particular operational mode,
    wherein whether the software flag is set and the hardware-based logic line is asserted depend on the electronic device.

12. The method of claim 11, further comprising:
a performing a requested operational mode if the requested operational mode is not disabled.

13. The method of claim 12, wherein the requested operational mode is performed when one or both of a software flag corresponding to the associated operational mode is not set and a hardware-based logic line corresponding to the associated operational mode is not asserted.

14. A method of mode based monitoring and cut-off determination of a battery used in an electronic device, the electronic device obtaining at least some power from the battery, the method comprising:
    waiting a mode-specific period of time after an operational mode is performed, the mode-specific period of time being based on a recovery time for the battery, the recovery time being specific to the performed operational mode; and
    determining a remaining charge level of the battery after waiting the period of time.

15. The method of claim 14, wherein one or both of the mode-specific period of time and the determined remaining charge level are a function of a chemistry of the battery.

16. The method of claim 14, further comprising:
disabling an operational mode of the device when the determined remaining charge level of the battery is insufficient to perform the operational mode; and
performing a requested operational mode if the requested operational mode has not been disabled.

17. A method of mode-based monitoring and cut-off determination of a battery used in an electronic device, the electronic device obtaining at least some power from the battery, the method comprising:
    determining a remaining charge level of the battery;
    disabling an operational mode of the device when the determined remaining charge of the battery is insufficient to perform the operational mode;
    performing a requested operational mode if the requested operational mode has not been disabled; and
    waiting a mode-specific period of time after performing the requested operational mode, the mode-specific period of time being based on a recovery time for the battery, the recovery time being specific to the performed operational mode.

18. The method of claim 17, wherein one or both of the mode-specific period of time and the determined remaining charge level are a function of a chemistry of the battery.

19. An electronic device having a plurality of operational modes and obtaining at least seine power from a battery, the device comprising:
    a battery monitor that measures a characteristic of a battery installed in the electronic device;
    a memory;
    a control program stored in the memory, the control program comprising a set of instructions; and
    a controller, wherein the battery monitor communicates a measured result to the controller, the controller executing the control program, the control program, when executed by the controller, implementing mode-based battery cut-off point determination, and wherein the set of instructions of the control program comprises determining whether a remaining charge level of the battery is sufficient to perform an operational mode of the plurality based on the measured result.

20. The electronic device of claim 19, wherein the mode-based cut-off point is a function of a battery chemistry of the battery.

21. The electronic device of claim 19, wherein the set of instructions of the control program further comprises:
    disabling an operational mode of the device when the remaining charge of the battery is insufficient to perform the operational made; and
    performing a requested operational mode if the requested operational mode has not been disabled.

22. The electronic device of claim 21, wherein the control program, when executed by the controller, further implements mode-based battery monitoring, the set of instructions further comprising:
    waiting a mode-specific period of time after the performed operational made, the period of time being based on a recovery time for the battery, the recovery time being specific to the performed operational mode.

23. The electronic device of claim 22, wherein the mode-specific period of time is further specific to a chemistry of the battery.

24. The electronic device of claim 22, wherein the set of instructions further comprises:
    determining a remaining charge level of the battery after waiting the mode-specific period of tune.

25. The electronic device of claim 24, wherein the determined remaining charge level is a function of a battery chemistry of the battery.

26. The electronic device of claim 19, wherein the control program, when executed by the controller, further implements mode-based battery monitoring, the set of instructions further comprising:
    waiting a mode-specific period of time after an operational mode is performed, the mode-specific period of time being based on a recovery time for the battery, the recovery time being specific to the performed operational mode.

27. The electronic device of claim 21, wherein the set of instructions further comprises notifying a user of the device of any disabled operational modes comprising one or more of displaying the disabled operational mode on a status display of the electronic device, displaying one or bath of a list of disabled operational modes and a list of enabled operational modes on the stats display, and using a 'Low Bat' display for each disabled operational mode.

28. An electronic device having a plurality of operational modes and obtaining at least some power from a battery, the device comprising:
- a battery monitor that measures a characteristic of a battery installed in the electronic device;
- a memory;
- a control program stored in the memory, the control program comprising a set of instructions; and
- a controller, wherein the battery monitor communicates a measured result to the controller, the controller executing the control program, the control program, when executed by the controller, implementing mode-based battery monitoring,
- wherein the set of instructions of the control program comprises waiting a mode-specific period of time after an operational mode is performed, the mode-specific period of time being based on a recovery time for the battery, the recovery time being specific to the performed operational mode.

29. The electronic device of claim 28, wherein the control program, when executed by the controller, further implements mode-based battery cut-off point determination, wherein the set of instructions of the control program further comprises determining a remaining charge level of the battery after waiting the mode-specific period of time.

30. The electronic device of claim 29, wherein the set of instructions of the control program further comprises:
- disabling an operational mode of the device when the determined remaining charge of the battery is insufficient to perform the operational mode; and
- performing a requested operational mode if the requested operational mode has not been disabled.

31. The electronic device of claim 30, wherein the set of instructions of the control program further comprises:
waiting another mode-specific period of time after the performed operational mode, the other mode-specific period of time being based on a recovery time for the battery, the recovery time being specific to the performed operational mode; and further comprises repeating:
- determining a remaining charge level of the battery after waiting the other mode-specific period of time;
- disabling those operational modes for which the repeated remaining charge level determination indicates insufficient remaining charge level; and
- performing other operational modes for which the repeated remaining charge level determination indicates sufficient remaining charge level.

32. The electronic device of claim 29, wherein the set of instruction further comprises determining a chemistry of the battery prior to waiting a mode-specific period of time after an operational mode is performed, the determined chemistry being used to modify the mode-specific wait time into a mode-specific and chemistry-specific wait time, and the determined chemistry being used in determining a remaining charge level of the battery.

33. The electronic device of claim 30, wherein the set of instructions further comprises notifying a user of the device of any disabled operational modes comprising one or more of displaying the disabled operational mode on a status display of the electronic device, displaying one or both of a list of disabled operational modes and a list of enabled operational modes on the status display, and using a 'Low Bat' display for each disabled operational mode.

* * * * *

UNITED STATES PATENT AND TRADEMARK OFFICE
CERTIFICATE OF CORRECTION

PATENT NO. : 7,123,155 B2
APPLICATION NO. : 10/116888
DATED : October 17, 2006
INVENTOR(S) : Charles E. Schinner It is certified that error appears in the above-identified patent and that said Letters Patent is hereby corrected as shown below:

In column 14, line 50, in Claim 10, delete "made" and insert -- mode --, therefor.

In column 15, line 2, in Claim 11, delete "comprising;" and insert -- comprising: --, therefor.

In column 15, line 10, in Claim 11, delete "mode:" and insert -- mode; --, therefor.

In column 15, line 26, in Claim 12, delete "a" before "performing".

In column 15, line 33, in Claim 14, delete "mode based" and insert -- mode-based --, therefor.

In column 16, line 5, in Claim 19, delete "seine" and insert -- some --, therefor.

In column 16, line 29, in Claim 21, delete "made;" and insert -- mode; --, therefor.

In column 16, line 37, in Claim 22, delete "made," and insert -- mode, --, therefor.

In column 16, line 46, in Claim 24, delete "tune." and insert -- time. --, therefor.

In column 16, line 64, in Claim 27, delete "bath" and insert -- both --, therefor.

In column 16, line 66, in Claim 27, delete "stats" and insert -- status --, therefor.

Signed and Sealed this

Fifth Day of May, 2009

JOHN DOLL
*Acting Director of the United States Patent and Trademark Office*